US012598894B2

(12) United States Patent
Park

(10) Patent No.: US 12,598,894 B2
(45) Date of Patent: Apr. 7, 2026

(54) DISPLAY DEVICE INCLUDING PASSIVATION LAYER

(71) Applicant: Samsung Display Co., LTD., Yongin-si (KR)

(72) Inventor: Raesun Park, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 364 days.

(21) Appl. No.: 18/177,621

(22) Filed: Mar. 2, 2023

(65) Prior Publication Data

US 2023/0403909 A1 Dec. 14, 2023

(30) Foreign Application Priority Data

Jun. 9, 2022 (KR) ........................ 10-2022-0070225

(51) Int. Cl.
| | |
|---|---|
| *H10K 59/80* | (2023.01) |
| *G06F 3/041* | (2006.01) |
| *H10K 59/40* | (2023.01) |
| *G06F 1/16* | (2006.01) |
| *G09F 9/30* | (2006.01) |
| *H10K 50/80* | (2023.01) |

(Continued)

(52) U.S. Cl.
CPC ......... *H10K 59/873* (2023.02); *G06F 3/0412* (2013.01); *H10K 59/40* (2023.02); *G06F 1/1652* (2013.01); *G06F 2203/04102* (2013.01); *G09F 9/301* (2013.01); *H10K 50/868* (2023.02); *H10K 59/12* (2023.02); *H10K 59/122* (2023.02); *H10K 2102/311* (2023.02)

(58) Field of Classification Search
CPC ...... H10K 59/873; H10K 59/40; H10K 59/12; H10K 59/131; H10K 59/8791; H10K 59/122; H10K 50/844; H10K 50/86; H10K 50/868; H10K 77/111; G06F 1/1652; G06F 3/0412; G09F 9/301
See application file for complete search history.

(56) References Cited

U.S. PATENT DOCUMENTS 10,522,783 B2 * 12/2019 Jo ......................... H10K 59/873
10,903,457 B2 * 1/2021 Cho ..................... H10K 50/865
(Continued)

FOREIGN PATENT DOCUMENTS

KR 10-2019-0054042 A 5/2019
KR 10-2019-0086603 A 7/2019
(Continued)

*Primary Examiner* — Ida M Soward
(74) *Attorney, Agent, or Firm* — Womble Bond Dickinson (US) LLP

(57) ABSTRACT

A display device includes a display panel including a first area, a second area, and a bending area between the first area and the second area, a passivation layer at the bending area, and at a part of the first area adjacent to the bending area, a polarization layer at the first area, and spaced apart from the passivation layer, and an organic insulating layer between the polarization layer and the display panel, having an end portion at the first area of the display panel, and including a first part that overlaps the polarization layer, a second part that overlaps the passivation layer at the first area, and a third part between the first part and the second part, and overlapping an entirety of a spacing area between the polarization layer and the passivation layer.

20 Claims, 6 Drawing Sheets

(51) Int. Cl.
    *H10K 59/12*              (2023.01)
    *H10K 59/122*          (2023.01)
    *H10K 102/00*         (2023.01)

(56)                References Cited

U.S. PATENT DOCUMENTS

| | | | |
|---|---|---|---|
| 10,963,076 B2 * | 3/2021 | Choi | H10K 59/122 |
| 11,233,112 B2 * | 1/2022 | Choi | H10K 77/111 |
| 11,362,292 B2 * | 6/2022 | Lee | H10D 30/6758 |
| 11,379,068 B1 * | 7/2022 | Kim | G06F 3/0412 |
| 11,776,943 B2 * | 10/2023 | Lee | H01L 25/18 |
| | | | 257/737 |
| 2016/0172623 A1 * | 6/2016 | Lee | B32B 3/04 |
| | | | 257/40 |
| 2018/0005568 A1 * | 1/2018 | Kim | H10K 59/122 |
| 2018/0130856 A1 * | 5/2018 | Kim | H10K 59/353 |
| 2018/0136527 A1 * | 5/2018 | Park | H10K 59/00 |
| 2019/0220122 A1 | 7/2019 | Shin | |
| 2019/0339741 A1 * | 11/2019 | Park | H10K 50/844 |
| 2019/0340959 A1 * | 11/2019 | Park | H10K 59/122 |
| 2020/0105840 A1 * | 4/2020 | Choi | G06F 3/0412 |
| 2020/0127229 A1 * | 4/2020 | Noh | H10K 59/87 |
| 2020/0201392 A1 * | 6/2020 | Yu | G06F 3/04164 |
| 2020/0203459 A1 * | 6/2020 | Wang | H10K 77/111 |
| 2021/0313387 A1 * | 10/2021 | Bang | H10H 20/853 |
| 2022/0102468 A1 * | 3/2022 | Lee | H10K 71/00 |
| 2022/0129040 A1 | 4/2022 | Kim et al. | |
| 2022/0320461 A1 * | 10/2022 | Dong | H10K 50/868 |
| 2024/0032350 A1 * | 1/2024 | Ye | G06F 3/04164 |

FOREIGN PATENT DOCUMENTS

| | | |
|---|---|---|
| KR | 10-2019-0128025 A | 11/2019 |
| KR | 10-2089340 B1 | 3/2020 |
| KR | 10-2020-0144626 A | 12/2020 |
| KR | 10-2021-0122955 A | 10/2021 |
| KR | 10-2022-0054486 A | 5/2022 |

* cited by examiner

DISPLAY DEVICE INCLUDING PASSIVATION LAYER

CROSS-REFERENCE TO RELATED APPLICATION

This application claims priority to, and the benefit of, Korean Patent Application No. 10-2022-0070225 filed in the Korean Intellectual Property Office on Jun. 9, 2022, the entire contents of that are incorporated herein by reference.

BACKGROUND

1. Field

The present disclosure relates to a display device including a bending area.

2. Description of the Related Art

In recent years, a display device has been developed, which includes a display panel manufactured by stacking multiple layers on a flexible substrate, such as plastic.

For example, a display panel of at least a part of a non-display area around a display area of the display device is folded back to locate at least a part of the non-display area at a rear surface of the display panel. As a result, a dead space of the display device can be reduced. A bent portion of the display panel is referred to as a bending area.

Further, the display device itself is flexible, so a form of at least a part of the display device can be transformed. The flexible display device can be divided into a bendable display device, a foldable display device, a rollable display device, a stretchable display device, etc., according to a use or a shape thereof. Among them, the foldable display device can be folded and unfolded like a book.

The above information disclosed in this Background section is only for enhancement of understanding of the background of the present disclosure, and therefore it may contain information that does not form the prior art.

SUMMARY

The present disclosure has been made to reduce a stress received by a bending area of a display panel, reduce or prevent the likelihood of a defect of the display panel by transformation of a flexible display panel, and reduce or block the inflow of external static electricity into a display panel.

One or more embodiments of the present disclosure provides a display device that includes a display panel including a first area, a second area, and a bending area between the first area and the second area, a passivation layer at the bending area, and at a part of the first area adjacent to the bending area, a polarization layer at the first area, and spaced apart from the passivation layer, and an organic insulating layer between the polarization layer and the display panel, having an end portion at the first area of the display panel, and including a first part that overlaps the polarization layer, a second part that overlaps the passivation layer at the first area, and a third part between the first part and the second part, and overlapping an entirety of a spacing area between the polarization layer and the passivation layer.

The spacing area may be blocked from an outside by the organic insulating layer.

The first part, the second part, and the third part may be contiguously formed.

The display device may further include a touch area between the display panel and the polarization layer, and including touch electrodes and the organic insulating layer.

The organic insulating layer may be above the touch electrodes.

The touch area may include a first touch electrode layer, a second touch electrode layer at a layer that is different from that of the first touch electrode layer, and that includes the touch electrodes, and the organic insulating layer between the first touch electrode layer and the second touch electrode layer.

The organic insulating layer may be between the display panel and the touch electrodes.

The display panel may include light emitting diodes, and an encapsulation layer above the light emitting diodes, wherein the organic insulating layer is above the encapsulation layer.

When the polarization layer and the passivation layer are spaced apart from each other in a first direction, a total width of the second part and the third part in the first direction may be about 223 micrometers or less.

The display device may further include a cover window above the polarization layer, and a protective film above the cover window.

The first area and the second area may overlap each other in a bending state.

The first area may include at least one transformed area that is transformable.

One or more other embodiments of the present disclosure provides a display device that includes a display panel including a first area, a second area, and a bending area between the first area and the second area, a passivation layer at the bending area, and at a part of the first area adjacent to the bending area, a polarization layer at the first area, and spaced apart from the passivation layer, and a touch area above the display panel, and including touch electrodes, and an organic insulating layer covering an entirety of a spacing area between the polarization layer and the passivation layer, and having an end portion at the first area of the display panel.

The organic insulating layer may further include a part between the polarization layer and the display panel, and a part between the passivation layer and the display panel.

The organic insulating layer may be contiguously formed from a portion that overlaps the polarization layer to a portion that overlaps the passivation layer.

The organic insulating layer may be above the touch electrodes.

The touch area may include a first touch electrode layer, a second touch electrode layer at a layer that is different from the first touch electrode layer and that includes the touch electrodes, and the organic insulating layer between the first touch electrode layer and the second touch electrode layer.

The organic insulating layer may be between the display panel and the touch electrodes.

The display panel may include light emitting diodes, and an encapsulation layer above the light emitting diodes, wherein the organic insulating layer is above the encapsulation layer.

Yet one or more other embodiments of the present disclosure provides a display device which includes a display panel including a first area, a second area, and a bending area between the first area and the second area, an organic insulating layer at the first area, a polarization layer above the organic insulating layer, and a passivation layer at the bending area and including an end portion spaced above the organic insulating layer apart from the polarization layer at the first area, wherein an end of the organic insulating layer is spaced apart from an end of the first area adjacent to the bending area.

According to embodiments of the present disclosure, it is possible to reduce a stress received by a bending area of a display panel, reduce or prevent the likelihood of a defect of the display panel by transformation of a flexible display panel, and reduce block the inflow of external static electricity into a display panel.

DETAILED DESCRIPTION

Figure 1:
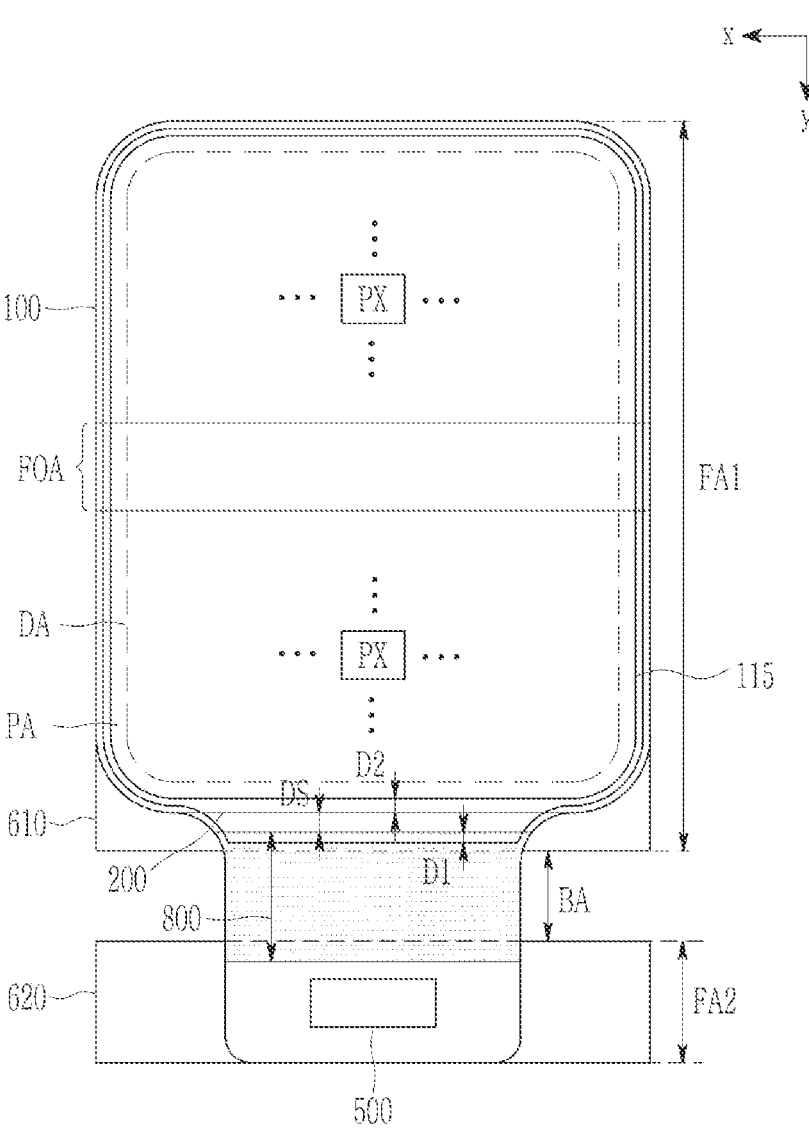
FIG. 1 is a plan view of a state in which a bending area of a display device is unfolded according to one or more embodiments.

Aspects of some embodiments of the present disclosure and methods of accomplishing the same may be understood more readily by reference to the detailed description of embodiments and the accompanying drawings. Hereinafter, embodiments will be described in more detail with reference to the accompanying drawings. The described embodiments, however, may have various modifications and may be embodied in various different forms, and should not be construed as being limited to only the illustrated embodiments herein. Rather, these embodiments are provided as examples so that this disclosure will be thorough and complete, and will fully convey the aspects of the present disclosure to those skilled in the art, and it should be understood that the present disclosure covers all the modifications, equivalents, and replacements within the idea and technical scope of the present disclosure. Accordingly, processes, elements, and techniques that are not necessary to those having ordinary skill in the art for a complete understanding of the aspects of the present disclosure may not be described.

Unless otherwise noted, like reference numerals, characters, or combinations thereof denote like elements throughout the attached drawings and the written description, and thus, descriptions thereof will not be repeated. Further, parts that are not related to, or that are irrelevant to, the description of the embodiments might not be shown to make the description clear.

In the drawings, the relative sizes of elements, layers, and regions may be exaggerated for clarity. Additionally, the use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified.

Various embodiments are described herein with reference to sectional illustrations that are schematic illustrations of embodiments and/or intermediate structures. As such, variations from the shapes of the illustrations as a result, for example, of manufacturing techniques and/or tolerances, are to be expected. Further, specific structural or functional descriptions disclosed herein are merely illustrative for the purpose of describing embodiments according to the concept of the present disclosure. Thus, embodiments disclosed herein should not be construed as limited to the particular illustrated shapes of regions, but are to include deviations in shapes that result from, for instance, manufacturing.

For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place.

Thus, the regions illustrated in the drawings are schematic in nature and their shapes are not intended to illustrate the actual shape of a region of a device and are not intended to be limiting. Additionally, as those skilled in the art would realize, the described embodiments may be modified in various ways, all without departing from the spirit or scope of the present disclosure.

In the detailed description, for the purposes of explanation, numerous specific details are set forth to provide a thorough understanding of various embodiments. It is apparent, however, that various embodiments may be practiced without these specific details or with one or more equivalent arrangements. In other instances, well-known structures and devices are shown in block diagram form to avoid unnecessarily obscuring various embodiments.

Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly. Similarly, when a first part is described as being arranged "on" a second part, this indicates that the first part is arranged at an upper side or a lower side of the second part without the limitation to the upper side thereof on the basis of the gravity direction.

Further, in this specification, the phrase "on a plane," or "plan view," means viewing a target portion from the top, and the phrase "on a cross-section" means viewing a cross-section formed by vertically cutting a target portion from the side.

It will be understood that when an element, layer, region, or component is referred to as being "formed on," "on," "connected to," or "coupled to" another element, layer, region, or component, it can be directly formed on, on, connected to, or coupled to the other element, layer, region, or component, or indirectly formed on, on, connected to, or coupled to the other element, layer, region, or component such that one or more intervening elements, layers, regions, or components may be present. In addition, this may collectively mean a direct or indirect coupling or connection and an integral or non-integral coupling or connection. For example, when a layer, region, or component is referred to as being "electrically connected" or "electrically coupled" to another layer, region, or component, it can be directly electrically connected or coupled to the other layer, region, and/or component or intervening layers, regions, or components may be present. However, "directly connected/directly coupled," or "directly on," refers to one component directly connecting or coupling another component, or being on another component, without an intermediate component. In addition, in the present specification, when a portion of a layer, a film, an area, a plate, or the like is formed on another portion, a forming direction is not limited to an upper direction but includes forming the portion on a side surface or in a lower direction. On the contrary, when a portion of a layer, a film, an area, a plate, or the like is formed "under" another portion, this includes not only a case where the portion is "directly beneath" another portion but also a case where there is further another portion between the portion and another portion. Meanwhile, other expressions describing relationships between components, such as "between," "immediately between" or "adjacent to" and "directly adjacent to" may be construed similarly. In addition, it will also be understood that when an element or layer is referred to as being "between" two elements or layers, it can be the only element or layer between the two elements or layers, or one or more intervening elements or layers may also be present.

For the purposes of this disclosure, expressions, such as "at least one of," when preceding a list of elements, modify the entire list of elements and do not modify the individual elements of the list. For example, "at least one of X, Y, and Z," "at least one of X, Y, or Z," and "at least one selected from the group consisting of X, Y, and Z" may be construed as X only, Y only, Z only, any combination of two or more of X, Y, and Z, such as, for instance, XYZ, XYY, YZ, and ZZ, or any variation thereof. Similarly, the expression, such as "at least one of A and B" may include A, B, or A and B. As used herein, "or" generally means "and/or," and the term "and/or" includes any and all combinations of one or more of the associated listed items. For example, the expression, such as "A and/or B" may include A, B, or A and B. Similarly, expressions, such as "at least one of," "a plurality of," "one of," and other prepositional phrases, when preceding a list of elements, modify the entire list of elements and do not modify the individual elements of the list.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure. The description of an element as a "first" element may not require or imply the presence of a second element or other elements. The terms "first," "second," etc. may also be used herein to differentiate different categories or sets of elements. For conciseness, the terms "first," "second," etc. may represent "first-category (or first-set)," "second-category (or second-set)," etc., respectively.

In the examples, the x-axis, the y-axis, and/or the z-axis are not limited to three axes of a rectangular coordinate system, and may be interpreted in a broader sense. For example, the x-axis, the y-axis, and the z-axis may be perpendicular to one another, or may represent different directions that are not perpendicular to one another. The same applies for first, second, and/or third directions.

The terminology used herein is for the purpose of describing particular embodiments only and is not intended to be limiting of the present disclosure. As used herein, the singular forms "a" and "an" are intended to include the plural forms as well, unless the context clearly indicates otherwise. It will be further understood that the terms "comprises," "comprising," "have," "having," "includes," and "including," when used in this specification, specify the presence of the stated features, integers, steps, operations, elements, and/or components, but do not preclude the presence or addition of one or more other features, integers, steps, operations, elements, components, and/or groups thereof.

As used herein, the term "substantially," "about," "approximately," and similar terms are used as terms of approximation and not as terms of degree, and are intended to account for the inherent deviations in measured or calculated values that would be recognized by those of ordinary skill in the art. "About" or "approximately," as used herein, is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within $\pm 30\%$, $20\%$, $10\%$, $5\%$ of the stated value. Further, the use of "may" when describing embodiments of the present disclosure refers to "one or more embodiments of the present disclosure."

Also, any numerical range disclosed and/or recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein, and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein. All such ranges are intended to be inherently described in this specification such that amending to expressly recite any such subranges would comply with the requirements of 35 U.S.C. § 112(a) and 35 U.S.C. § 132(a).

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

A display device according to one or more embodiments will be described with reference to FIGS. 1 to 4.

Figure 2:
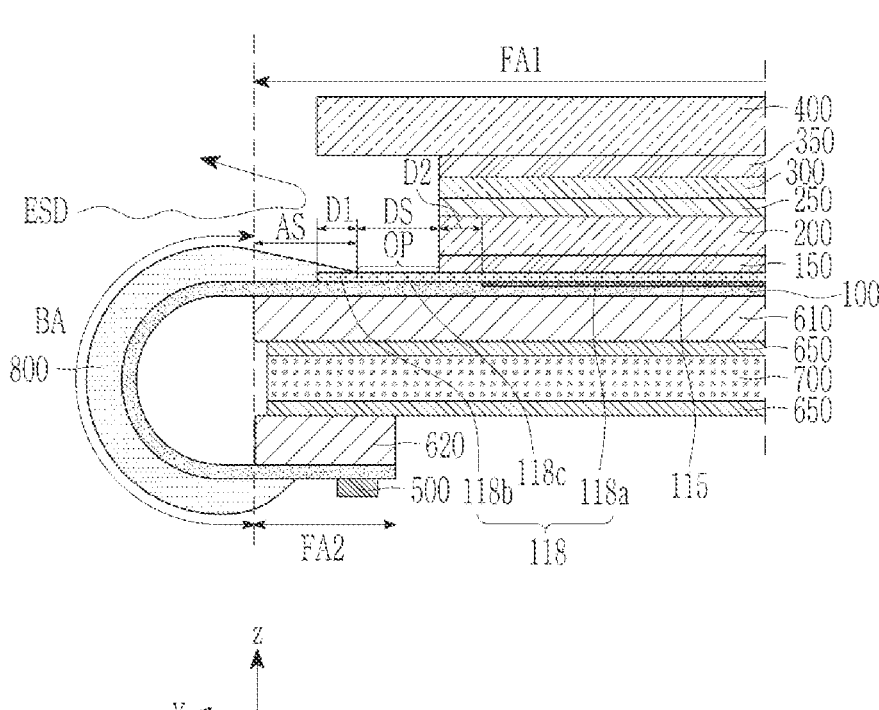
FIG. 2 is a cross-sectional view in a state in which the bending area of the display device is bent according to one or more embodiments.
Figure 3:
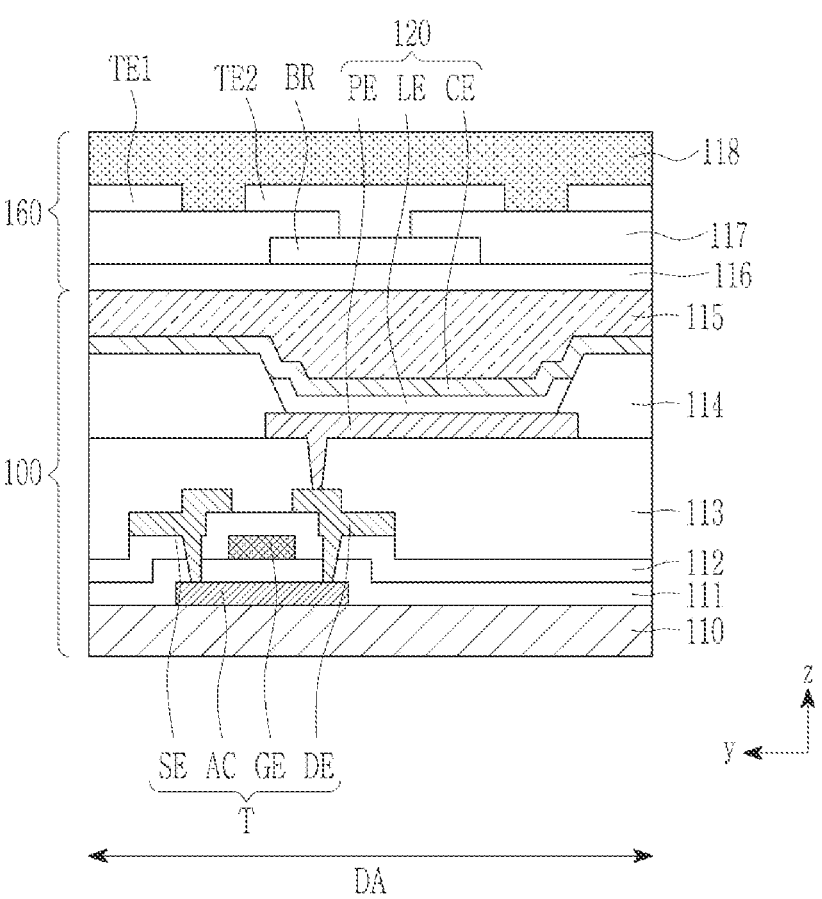
FIG. 3 is a cross-sectional view of a display area of the display device according to one or more embodiments.

FIG. 1 is a plan view of a state in which a bending area of a display device is unfolded according to one or more embodiments, FIG. 2 is a cross-sectional view in a state in which the bending area of the display device is bent according to one or more embodiments, and FIG. 3 is a cross-sectional view of a display area of the display device according to one or more embodiments Referring to FIG. 1, the display device according to one or more embodiments includes a display panel 100.

The display panel 100 includes a display area DA capable of displaying an image, and a peripheral area PA positioned on a periphery of the display area DA. The peripheral area PA may be a non-display portion that does not display an image.

The display area DA may include a plurality of pixels PX that are a unit of displaying the image, and a plurality of signal lines, such as a gate line and a data line, that are electrically connected to the pixel PX.

The display panel 100 may include a bending area BA, and a first area FA1 and a second area FA2 positioned at respective sides of the bending area BA.

The display area DA is positioned in the first area FA1. The second area FA2 may be positioned in the peripheral area PA (e.g., when the bending area is bent), and a driving unit 500 may be positioned in the second area FA2. The driving unit 500 may be a form of a chip on film (COF), or a printed circuit board form, and may supply a driving signal to the display area DA to drive the display device.

The display panel 100 may be bent in the bending area BA. The bending area BA may be bent based on an axis that is substantially parallel to an x direction. In a state in which the display panel 100 is bent, the first area FA1 and the second area FA2 may face while overlapping with each other in a z direction vertical to an xy-plane direction as illustrated in FIG. 2. Thereafter, an upper portion on a cross section means the z direction illustrated in FIG. 2.

Referring to FIGS. 1 and 2, the display device according to one or more embodiments includes a passivation layer 800 formed on an upper surface that is one surface of the display panel 100. The passivation layer 800 may overlap with the bending area BA and a partial area of the first area FA1 at a periphery of the bending area BA. The passivation layer 800 may also overlap with a partial area of the second area FA2 at a periphery of the bending area BA.

Referring to FIG. 2, when the bending area BA of the display panel 100 is bent, the passivation layer 800 may include a portion positioned on an outer surface of the bending area BA, a portion positioned on the upper surface of the first area FA1, and a portion positioned on a lower surface of the second area FA2, and these portions may be formed to be contiguous with each other. One end of the passivation layer 800 and an edge thereof are positioned above the first area FA1 of the display panel 100 adjacent to the bending area BA, and the other end of the passivation layer 800 and an edge thereof are positioned above the second area FA2 of the display panel 100 adjacent to the bending area BA. The passivation layer 800 covers at least a part of a boundary between the bending area BA and the first area FA1 and a boundary between the bending area BA and the second area FA2.

Referring to FIGS. 1 and 2, the display device according to one or more embodiments may include a polarization layer 200 that overlaps with the first area FA1 of the display panel 100 on an xy plane. Referring to FIG. 2, the polarization layer 200 may be positioned above the display panel 100.

The polarization layer 200 may reduce reflection of external light that is incident from an upper portion of the display panel 100. When the external light is reflected on the display panel 100 through the polarization layer 200, and then passes through the polarization layer 200 again, a phase of the external light is changed. Therefore, a phase of reflection light and a phase of external light that enters the polarization layer 200 are different, and as a result, extinction interference may occur between the reflection light and the external light.

Referring to FIG. 1, the first area FA1 may include at least one transformed area FOA in which the display panel 100 may be transformed. For example, in the case of the foldable display device, the transformed area FOA may be a folding area that may be bent where the display device may be folded. In this case, the remaining parts of the first area FA1, which are other than the transformed area FOA, may be a non-folding area that is not transformed. The transformed area FOA may be folded based on an axis that is substantially parallel to the x direction.

Even in the transformed area FOA, the pixel PX is positioned to display the image.

The display area DA may be segmented into two or more areas based on the transformed area FOA. FIG. 1 illustrates an example in which the display area DA is segmented into two areas based on one transformed area FOA.

A stacking structure of the display device will be described with reference to FIGS. 2 and 3.

Referring to FIG. 2, the polarization layer 200 is positioned in the first area FA1 of the display panel 100. An adhesive layer 150 may be positioned between the polarization layer 200 and the display panel 100.

Referring to FIG. 3, a touch area 160 capable of sensing a touch may be positioned between the display panel 100 and the adhesive layer 150 or between the display panel 100 and the polarization layer 200. The touch area 160 includes at least one organic insulating layer 118 that is positioned between the polarization layer 200 and the display panel 100. A thickness of the organic insulating layer 118 may be, for example, about 2 micrometers to about 4 micrometers, but is not limited thereto.

A cover window 300 may be positioned on the polarization layer 200. An adhesive layer 250 may be positioned between the cover window 300 and the polarization layer 200. The cover window 300 may include at least one of glass and/or a polymer resin.

At least one protective film 400 may be positioned on the cover window 300. An adhesive layer 350 may be positioned between the cover window 300 and the protective film 400. The protective film 400 may include at least one of polymer resins including Polyethyleneterephthalate (PET), Poly (butylene terephthalate) (PBT), Polycarbonate (PC), Polyethylene Naphthalate (PEN), Polystyrene (PS), polymethylmethacrylate (PMMA), Polyvinylchloride (PVC), Polyethersulfone (PES), Polypropylene (PP), Polyamide (PA), etc.

Another film or layer may be positioned on the polarization layer 200, and an adhesive layer may be interposed between neighboring layers or films.

The adhesive layers 150, 250, and 350 may be optically transparent adhesive layers, and may include a material having a smaller modulus than the polarization layer 200 and the cover window 300. For example, the adhesive layers 150, 250, and 350 may include an optically clear adhesive (OCA), an Optically clear resin (OCR), or a Pressure Sensitive Adhesive (PSA). For example, the adhesive layers 150, 250, and 350 may include polymer resins, such as an acrylic material, a silicone-based material, rubber, polyurethane, vinyl acetate, epoxy resin, Styrene-Butadiene-Styrene (SBS), etc.

The passivation layer 800 positioned on the bending area BA may reduce a damage of a wire of the bending area BA by reducing tensile stress or compression stress received by the bending area BA by raising a neutral surface when the bending area BA is bent.

The passivation layer 800 may include a UV-curing type of resin, but a material is not limited thereto. For example, the passivation layer 800 may include organic materials, such as polyimide, epoxy-based resin, acrylic resin, polyester, photoresist, polyacrylic resin, polyimide-based resin, polyamide-based resin, and siloxane-based resin, and resins, such as silicon, urethane, thermoplastic polyurethane, etc. The thickness of the passivation layer 800 may be, for example, about 50 micrometers to about 100 micrometers, but is not limited thereto.

One end of the polarization layer 200, and one end of the passivation layer 800 facing the one end of the polarization layer 200, are spaced apart from each other by a spacing distance DS larger than 0 on the first area FA1 adjacent to the bending area BA of the display panel 100. The spacing distance DS may depend on a flexible feature of the display device.

When the display device is bent in the transformed area FOA as described above, a slip phenomenon may occur in which adjacent layers stacked with the adhesive layer, such as the display panel 100, the polarization layer 200, the cover window 300, the protective film 400, etc. slip along a surface. For example, when the polarization layer 200/ adhesive layer 150 and the passivation layer 800 above the display panel 100 are not spaced apart from each other by a sufficient distance, the polarization layer 200 that slips with respect to the display panel 100 may collide with one end of the passivation layer 800, and stress may be applied to the display panel 100 when the display device is transformed, so that a crack may occur in the display panel 100.

However, according to one or more embodiments, because one end of the polarization layer 200, and one end of the passivation layer 800 facing the one end of the polarization layer 200, are spaced apart from each other by the spacing distance DS by considering a transformation degree of the display device, the polarization layer 200 that slips with respect to the display panel 100 does not collide with one end of the passivation layer 800 when the display device is transformed, thereby reducing or preventing the likelihood of a defect, such as a crack in the display panel 100.

According to one or more embodiments, at least one organic insulating layer 118, which is positioned between the display panel 100 and the polarization layer 200, is further extended and includes a part positioned between one end/one end region of the passivation layer 800 on the first area FA1 and the display panel 100, and also includes a part covering a spacing area OP between the polarization layer 200 and the passivation layer 800, as illustrated in FIG. 2.

On an xy plan view, at least one organic insulating layer 118 positioned between the display panel 100 and the polarization layer 200, or between the display panel 100 and the adhesive layer 150, includes a first part 118a that overlaps with the polarization layer 200, a second part 118b positioned between the display panel 100 and a portion adjacent to one end of the passivation layer 800 on the first area FA1, and a third part 118c positioned between the first part 118a and the second part 118b, and positioned in the spacing area OP between the polarization layer 200 and the passivation layer 800 (e.g., in plan view). The first part 118a, the second part 118b, and the third part 118c may be contiguously formed.

An end portion of the organic insulating layer 118 that overlaps with the passivation layer 800 is positioned on the first area FA1 of the display panel. An end portion of the passivation layer 800 positioned on the first area FA1 overlaps with the organic insulating layer 118. The third part 118c overlaps with the entire spacing area OP.

The display panel 100 below the spacing area OP between the polarization layer 200 and the passivation layer 800 may be blocked from the outside by at least one organic insulating layer 118 extended above the spacing area OP.

Therefore, as illustrated in FIG. 2, static electricity (ESD) that may be introduced from the outside is blocked by the extended organic insulating layer 118, and thus may not penetrate the spacing area OP between the polarization layer 200 and the passivation layer 800, thereby reducing or preventing the likelihood of a defect in the display panel 100 that occurs due to the static electricity.

A distance from an end of the polarization layer 200 to an end of the organic insulating layer 118 toward the bending area BA (e.g., a sum of a first width D1 of the organic insulating layer 118 that overlaps with the passivation layer 800, and a spacing distance DS of the spacing area OP, in a y-direction) may be, for example, about 223 micrometers or less, and when the sum is equal to or more than about 223 micrometers, stress may increase at the edge portion of the bending area BA, and as a result, there may be a risk that a crack will occur in the bending area BA of the display panel 100.

The first width D1 may be larger than 0, and may be about 25% or less of a y-direction width AS between a boundary (corresponding to an end of a protective member 610 to be described below) between the bending area BA and the first area FA1, and an end of the passivation layer 800 positioned on the first area FA1. That is, the first width D1 of a portion of the passivation layer 800 that overlaps with the organic insulating layer 118 may be positioned on the first area FA1, and may be about 25% or less of the width AS of the passivation layer 800 that overlaps with the first area FA1 (e.g., the width AS of the passivation layer 800 contacting the display panel 100 in the first area FA1). For example, when the width AS is about 300 micrometers, the first width D1 may be about 75 micrometers or less. When the first width D1 is about 25% larger than the width AS, the organic insulating layer 118 may apply strain to the display panel 100 by the passivation layer 800 receiving tensile stress while being pulled when the bending area BA is bent, so there may be a relatively high risk that the crack will occur in the wire of the display panel 100 on the periphery of the display panel 100.

A gap between the end of the organic insulating layer 118 and the end of the first area FA1 adjacent to the bending area BA may be larger than 0. That is, the end of the organic insulating layer 118 and the end of the first area FA1 may be spaced apart from each other.

The protective member 610 may be positioned on a lower surface (in other words, a back surface) of the first area FA1 of the display panel 100 in the state in which the bending area BA is bent. Further, another protective member 620 may be positioned on an upper surface (in other words, the back surface) of the second area FA2 of the display panel 100. In one or more embodiments, the adhesive layer may be positioned between the display panel 100 and the protective members 610 and 620. The protective members 610 and 620 may serve to support and protect the display panel 100.

An opening between the protective members 610 and 620 may be positioned on the lower surface of the bending area BA. That is, the protective members 610 and 620 may be omitted from the area that overlaps with the bending area BA, so that the display panel 100 may be suitably bent in the bending area BA.

The protective members 610 and 620 may include polymer resins including an acrylic-based compound, polyethyleneterephthalate (PET), polyimide (PI), etc.

A spacer 700 may be positioned between (e.g., with respect to the z direction) the protective member 610 located on the back surface of the first area FA1 and the protective member 620 located on the back surface of the second area FA2 when the bending area BA of the display panel 100 is bent. The spacer 700 may support the display panel 100 in the state in which the bending area BA is bent. The spacer 700 may be attached to each of the protective members 610 and 620 through an adhesive layer(s) 650.

A cross-sectional structure of the display panel 100 and the touch area 160 according to one or more embodiments will be described with reference to FIG. 3 jointly with the above-described drawings.

The display panel 100 according to one or more embodiments may include a substrate 110, and a plurality of layers stacked on the substrate 110. The substrate 110 may be a flexible substrate including a plastic material, such as polyimide (PI), etc.

A semiconductor layer AC of a transistor T may be positioned on the substrate 110, and a gate insulating layer 111 may be positioned thereon. The semiconductor layer AC may include a source area, a drain area, and a channel area between the areas. The semiconductor layer AC may include at least one of polycrystalline silicon, amorphous silicon, or an oxide semiconductor. The gate insulating layer 111 may include an inorganic insulating material, such as oxide silicon, nitride silicon, etc.

A gate conductive layer including a gate electrode GE of the transistor T may be positioned on the gate insulating layer 111. The gate conductive layer may include, for example, metal, such as molybdenum (Mo), copper (Cu), aluminum (Al), silver (Ag), chromium (Cr), titanium (Ti), tantalum (Ta), and metal alloys thereof.

A first insulating layer 112 may be positioned on the gate conductive layer. The first insulating layer 112 may include an inorganic insulating material.

A data conductive layer including a source electrode SE and a drain electrode DE of the transistor T may be positioned on the first insulating layer 112. The source electrode SE and the drain electrode DE may be respectively electrically connected to the source area and the drain area of the semiconductor layer AC through holes of the first insulating layer 112 and the gate insulating layer 111.

A data conductive layer may include, for example, metal, such as aluminum (Al), copper (Cu), silver (Ag), molybdenum (Mo), chromium (Cr), gold (Au), platinum (Pt), palladium (Pd), tantalum (Ta), tungsten (W), titanium (Ti), nickel (Ni), and metal alloys thereof.

A second insulating layer 113 may be positioned on the data conductive layer. The second insulating layer 113 may include an organic insulating material.

A pixel electrode PE may be positioned on the second insulating layer 113. The pixel electrode PE is electrically connected to the drain electrode DE of the transistor T through the hole of the second insulating layer 113 to receive a data signal.

A third insulating layer 114 may be positioned on the second insulating layer 113 and the pixel electrode PE. The third insulating layer 114 may have an opening that overlaps with the pixel electrode PE. The third insulating layer 114 may include the organic insulating material.

A light emitting layer LE is positioned in the opening of the third insulating layer 114 on the pixel electrode PE, and a common electrode CE is positioned on the light emitting layer LE.

The pixel electrode PE, the light emitting layer LE, and the common electrode CE jointly constitute a light emitting diode 120. The pixel electrode PE may be an anode electrode of the light emitting diode 120, and the common electrode CE may be a cathode electrode of the light emitting diode 120.

An encapsulation layer 115 sealing and protecting the light emitting diode 120 may be positioned on the common electrode CE. The encapsulation layer 115 may include at least one inorganic insulating layer and at least one organic insulating layer, and the organic insulating layer and the inorganic insulating layer may be alternatively stacked. In some embodiments, an encapsulation substrate may also be positioned instead of the encapsulation layer 115.

Referring to FIGS. 2 and 3, the encapsulation layer 115 (e.g., an end portion of the inorganic insulating layer included in the encapsulation layer 115) may overlap with the polarization layer 200. A second width D2 that is a gap between the end portion of the encapsulation layer 115 and the end portion of the polarization layer 200 facing the end portion of the encapsulation layer 115, in a y direction, is larger than 0. A total length of the spacing distance DS, the first width D1, and the second width D2 may be about 300 micrometers or less, but is not limited thereto.

At least one fourth insulating layer 116 may be positioned on the encapsulation layer 115. A fourth insulating layer 116 may include an inorganic insulating material, such as oxide silicon, nitride silicon, etc., or may include an organic insulating material. The fourth insulating layer 116 may also be included in the touch area 160, and also may be referred to as an interlayer insulating layer between the touch area 160 and the display panel 100.

A first touch electrode layer BR may be positioned on the fourth insulating layer 116. A fifth insulating layer 117 may be positioned on the first touch electrode layer BR, and second touch electrode layers TE1 and TE2 may be positioned thereon. According to the one or more embodiments corresponding to FIG. 3, the second touch electrode layers TE1 and TE2 may include a plurality of first touch electrodes TE1 and a plurality of second touch electrodes TE2. The neighboring first touch electrode TE1 and second touch electrode TE2 may jointly form a multi-type touch sensor, or each of the first touch electrode TE1 and the second touch electrode TE2 may form a self-type touch sensor. The first touch electrode TE1 and the second touch electrode TE2 may be positioned on the same layer.

The plurality of first touch electrodes TE1 that are neighboring in one direction may be electrically connected to each other, and the plurality of second touch electrodes TE2 that are neighboring in the other direction may be electrically connected to each other. According to the one or more embodiments corresponding to FIG. 3, the plurality of first touch electrodes TE1 that are neighboring in one direction may be connected to each other through a connection portion positioned on the same layer as the first touch electrode TE1, and the plurality of second touch electrodes TE2 that are neighboring in the other direction may be electrically connected to each other through a bridge of a different layer from the second touch electrode TE2 (e.g., of the first touch electrode layer BR).

The fifth insulating layer 117 may include the inorganic insulating material, such as oxide silicon, nitride silicon, etc. or may include the organic insulating material.

An organic insulating layer 118 that is a sixth insulating layer may be positioned on the second touch electrode layers TE1 and TE2. That is, the above-described organic insulating layer 118 may be the sixth insulating layer positioned on the second touch electrode layers TE1 and TE2. The sixth insulting layer may form a top insulating layer of the touch area 160. The sixth insulating layer/the organic insulating layer 118 may include the organic insulating material.

A structure of the periphery of the bending area of the display device according to one or more embodiments will be described with reference to FIG. 4 jointly with the above-described drawings.

Figure 4:
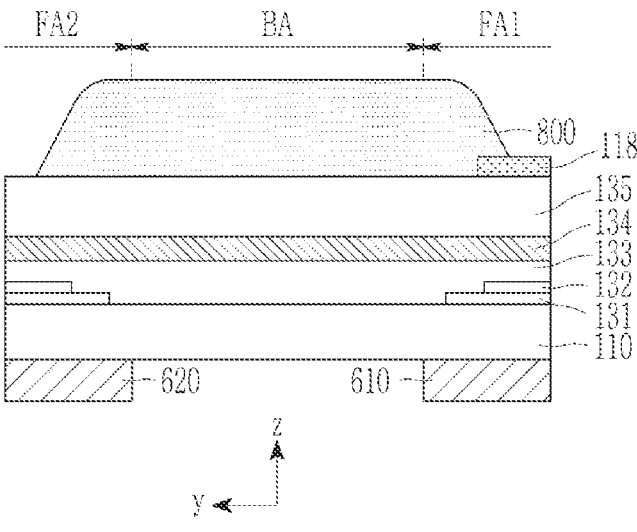
FIG. 4 is a cross-sectional view of the bending area of the display device and a periphery thereof according to one or more embodiments.

FIG. 4 is a cross-sectional view of the bending area of the display device and a periphery thereof according to one or more embodiments.

The bending area BA of the display panel 100 according to one or more embodiments includes a plurality of layers, and overlaps with the passivation layer 800. The plurality of layers includes the substrate 110, at least one wiring layer 134, and at least one insulating layer 133 and 135.

The plurality of layers of the bending area BA includes a layer formed by extending at least a part of a layer positioned in the first area FA1 or the second area FA2. For example, the bending area BA may include the substrate 110, and at least one of the second insulating layer 113 and/or the third insulating layer 114 described in FIG. 3. The insulating layer 135 may include at least one of the second insulating layer 113 and/or the third insulating layer 114 described in FIG. 4.

Figure 5:
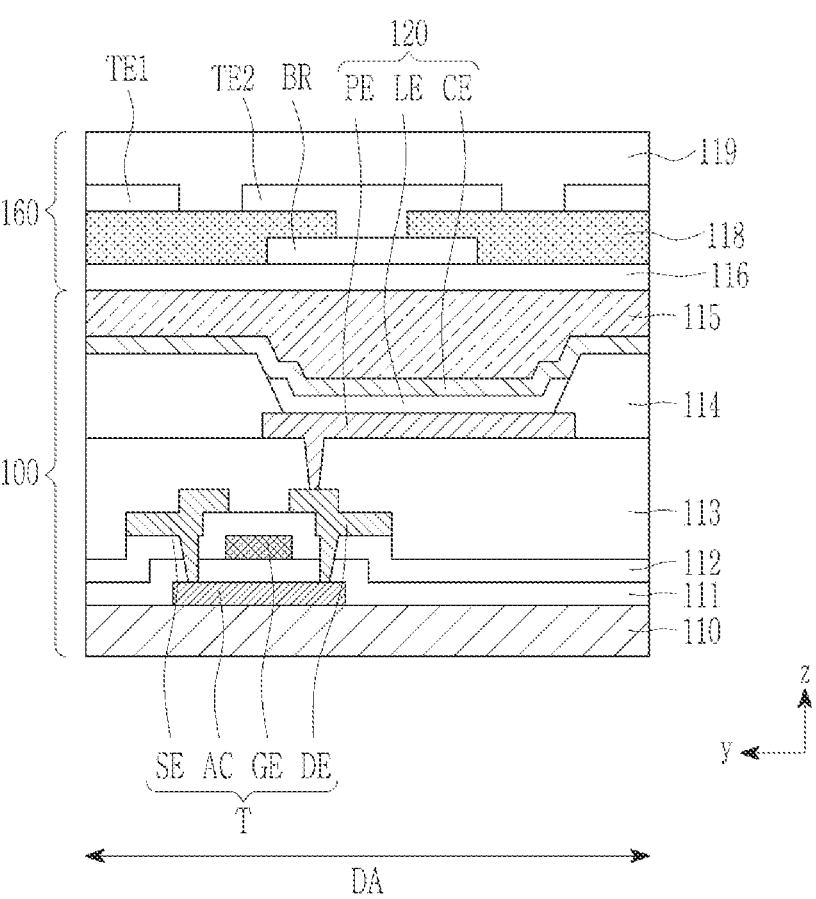
FIG. 5 is a cross-sectional view of the display area of the display device according to one or more embodiments.

The insulating layer 133 positioned below or above the insulating layer 135 may be an organic insulating layer that is not positioned in the first area FA1 or the second area FA2. In FIG. 5, an example in which the insulating layer 133 is positioned below the insulting layer 135 is illustrated, but the present disclosure is not limited thereto, and the insulating layer 133 may also be positioned above the insulating layer 135.

The wiring layer 134 may be positioned between two neighboring insulating layers 133 and 135. The wiring layer 134 may include a signal line electrically connecting the driving unit 500 illustrated in FIGS. 1 and 2 and the display area DA positioned in the first area FA1. The signal line of the wiring layer 134 is connected to the data line through a pad portion by crossing the bending area BA to supply the data signal.

The wiring layer 134 may be positioned on the same layer as the gate conductive layer or as the data conductive layer positioned in the first area FA1 or in the second area FA2, and may include the same material.

As illustrated in FIG. 4, the inorganic insulating layers 131 and 132 positioned in the first area FA1 or in the second area FA2 may include an end portion that is not extended to the bending area BA, but instead is positioned in the vicinity of the bending area BA. The inorganic insulating layers 131 and 132 may include the gate insulating layer 111, the first insulating layer 112, etc., described above, for example.

Unlike this, an inorganic insulating layer having a thickness and a shape of a degree at which a crack is unlikely to occur, even while bending the bending area BA, may also be positioned in the bending area BA.

An opening between the protective members 610 and 620 may be positioned on the lower surface of the bending area BA.

Each layer illustrated in FIGS. 3 and 4 may be constituted by a single layer or multiple layers.

A display device according to one or more embodiments will be described with reference to FIGS. 5 and 6 jointly with the above-described drawings.

Figure 6:
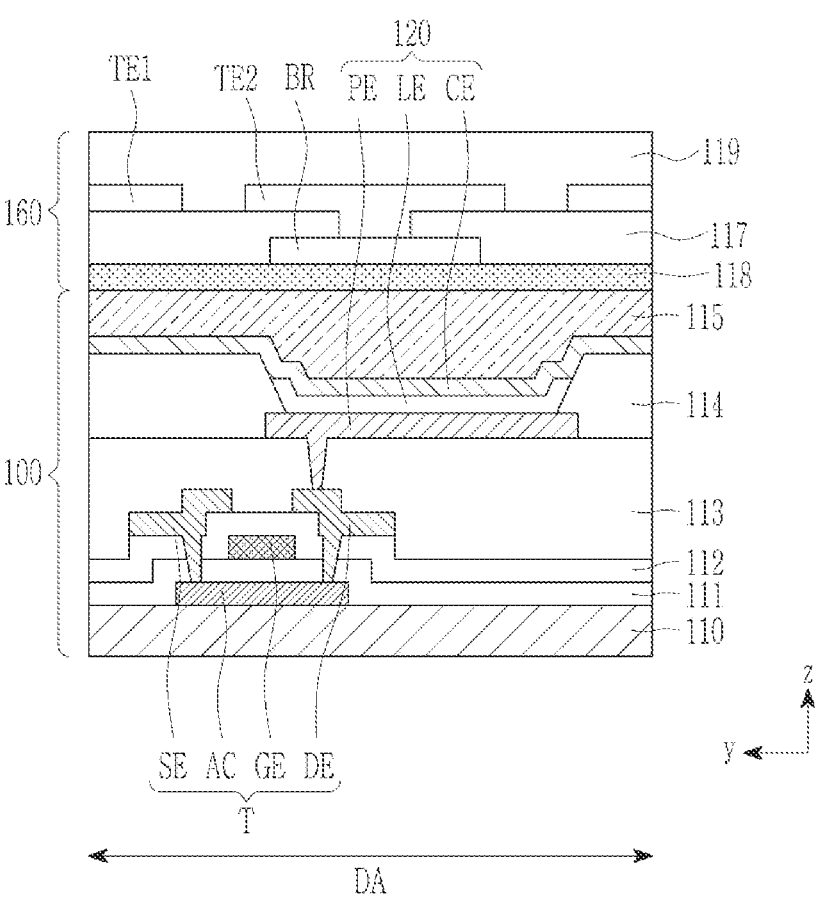
FIG. 6 is a cross-sectional view of a display area of the display device according to one or more embodiments.

Each of FIGS. 5 and 6 is a cross-sectional view of a display area of the display device according to one or more embodiments.

First, referring to FIG. 5, the display device according to one or more embodiments is mostly the same as the display device according to one or more of the embodiments described above, but the location of the insulating layer of the touch area 160 may be different. According to one or more embodiments, the insulating layer positioned between the first touch electrode layer BR, and the second touch electrode layers TE1 and TE2, may be the organic insulating layer 118. That is, the organic insulating layer 118 positioned between the first touch electrode layer BR and the second touch electrode layers TE1 and TE2 may include a part that extends toward the bending area BA and that overlaps with the polarization layer 200, a first part 118a that overlaps with the polarization layer 200, a second part 118b that overlaps with a partial area of one end of the passivation layer 800, and a third part 118c that overlaps with the spacing area OP between the polarization layer 200 and the passivation layer 800.

Next, referring to FIG. 6, the display device according to one or more embodiments is mostly the same as the display device according to one or more of the embodiments described above, but the location of the insulating layer of the touch area 160 may be different. According to one or more embodiments, the insulating layer positioned between the first touch electrode layer BR and the encapsulation layer 115 may be the organic insulating layer 118. That is, the organic insulating layer 118 positioned between the first touch electrode layer BR and the encapsulation layer 115 may include a first part 118a that extends toward the bending area BA and that overlaps with the polarization layer 200, a second part 118b that overlaps with a partial area of one end of the passivation layer 800, and a third part 118c that overlaps with the spacing area OP between the polarization layer 200 and the passivation layer 800.

In the one or more embodiments corresponding to FIG. 6, the organic insulating layer 118 may be in contact with the encapsulation layer 115.

While the present disclosure has been described in connection with what is presently considered to be practical embodiments, it is to be understood that the present disclosure is not limited to the disclosed embodiments. On the contrary, it is intended to cover various modifications and equivalent arrangements included within the spirit and scope of the appended claims, with functional equivalents thereof to be included therein.

| Description of symbols | |
| --- | --- |
| 100: Display panel | 110: Substrate |
| 111: Gate insulation layer | 112, 113, 114, 116, 117, 133, 135: Insulation layer |
| 115: Encapsulation layer | 118: Organic insulating layer |
| 120: Light emitting diode | 131, 132: Inorganic insulation layer |

-continued

Description of symbols

| | |
|---|---|
| 134: Wiring layer | 150, 250, 350, 650: Adhesive layer |
| 160: Touch area | 200: Polarization layer |
| 300: Cover window | 400: Protective film |
| 500: Driving unit | 610, 620: Protective member |
| 700: Spacer | 800: Passivation layer |
| BA: Bending area | BR, TE1, TE2: Touch electrode layer |
| DA: Display area | FA1: First region |
| FA2: Second region | FOA: Transformed area |
| OP: Spacing area | PA: Peripheral area |

What is claimed is:

1. A display device comprising:
a display panel comprising a first area, a second area, and a bending area between the first area and the second area;
a passivation layer at the bending area, and at a part of the first area adjacent to the bending area;
a polarization layer at the first area, and spaced apart from the passivation layer; and
an organic insulating layer between the polarization layer and the display panel, the organic insulating layer having an end at the first area of the display panel, and comprising:
a first part overlapped by the polarization layer;
a second part overlapped by the passivation layer at the first area; and
a third part between the first part and the second part, and overlapped by an entirety of a spacing area between the polarization layer and the passivation layer.

2. The display device of claim 1, wherein the spacing area is blocked from an outside by the organic insulating layer.

3. The display device of claim 2, wherein the first part, the second part, and the third part are contiguously formed.

4. The display device of claim 3, further comprising a touch area between the display panel and the polarization layer, and comprising touch electrodes and the organic insulating layer.

5. The display device of claim 4, wherein the organic insulating layer is above the touch electrodes.

6. The display device of claim 4, wherein the touch area comprises:
a first touch electrode layer;
a second touch electrode layer at a layer that is different from that of the first touch electrode layer, and that comprises the touch electrodes; and
the organic insulating layer between the first touch electrode layer and the second touch electrode layer.

7. The display device of claim 4, wherein the organic insulating layer is between the display panel and the touch electrodes.

8. The display device of claim 1, wherein the display panel comprises light emitting diodes, and an encapsulation layer above the light emitting diodes, and
wherein the organic insulating layer is above the encapsulation layer.

9. The display device of claim 1, wherein, when the polarization layer and the passivation layer are spaced apart from each other in a first direction, a total width of the second part and the third part in the first direction is about 223 micrometers or less.

10. The display device of claim 1, further comprising:
a cover window above the polarization layer; and
a protective film above the cover window.

11. The display device of claim 1, wherein the first area and the second area overlap each other in a bending state.

12. The display device of claim 1, wherein the first area comprises at least one transformed area that is transformable.

13. A display device comprising:
a display panel comprising a first area, a second area, and a bending area between the first area and the second area;
a passivation layer at the bending area, and at a part of the first area adjacent to the bending area;
a polarization layer at the first area, and spaced apart from the passivation layer; and
a touch area above the display panel, and comprising:
touch electrodes; and
an organic insulating layer overlapped by an entirety of a spacing area between the polarization layer and the passivation layer, and the organic insulating layer having an end at the first area of the display panel.

14. The display device of claim 13, wherein the organic insulating layer further comprises a part between the polarization layer and the display panel, and a part between the passivation layer and the display panel.

15. The display device of claim 14, wherein the organic insulating layer is contiguously formed from a portion that overlaps the polarization layer to a portion that overlaps the passivation layer.

16. The display device of claim 13, wherein the organic insulating layer is above the touch electrodes.

17. The display device of claim 13, wherein the touch area comprises:
a first touch electrode layer;
a second touch electrode layer at a layer that is different from the first touch electrode layer and that comprises the touch electrodes; and
the organic insulating layer between the first touch electrode layer and the second touch electrode layer.

18. The display device of claim 13, wherein the organic insulating layer is between the display panel and the touch electrodes.

19. The display device of claim 13, wherein the display panel comprises light emitting diodes, and an encapsulation layer above the light emitting diodes, and wherein the organic insulating layer is above the encapsulation layer.

20. A display device comprising:
a display panel comprising a first area, a second area, and a bending area between the first area and the second area;
an organic insulating layer at the first area;
a polarization layer above the organic insulating layer; and
a passivation layer at the bending area, an end of the passivation layer being above the organic insulating layer and spaced apart from the polarization layer at the first area,
wherein an end of the organic insulating layer is spaced apart from an end of the first area adjacent to the bending area.

* * * * *